United States Patent [19]
Zerlaut et al.

[11] Patent Number: 4,467,438
[45] Date of Patent: Aug. 21, 1984

[54] METHOD AND APPARATUS FOR DETERMINING SPECTRAL RESPONSE AND SPECTRAL RESPONSE MISMATCH BETWEEN PHOTOVOLTAIC DEVICES

[75] Inventors: Gene A. Zerlaut; Richard D. Whitaker, both of Phoenix; Arthur W. Purnell, New River, all of Ariz.

[73] Assignee: DSET Laboratories, Inc., Phoenix, Ariz.

[21] Appl. No.: 340,038

[22] Filed: Jan. 18, 1982

[51] Int. Cl.$^3$ .............................................. G06F 15/20
[52] U.S. Cl. .................................. 364/525; 136/290; 356/405; 356/408
[58] Field of Search ................ 364/525; 136/243, 290, 136/293; 356/303, 306, 320, 327, 405, 408, 418; 324/426, 434

[56] References Cited
U.S. PATENT DOCUMENTS

| | | | |
|---|---|---|---|
| 3,350,635 | 10/1967 | Mesch | 136/290 X |
| 3,525,571 | 8/1970 | Gebel | 364/525 X |
| 3,812,350 | 5/1974 | Szabo et al. | 356/405 X |
| 4,163,194 | 7/1979 | Ross | 136/290 UX |
| 4,278,538 | 7/1981 | Lawrence et al. | 356/405 X |
| 4,291,985 | 9/1981 | Tsujimura | 356/408 |

OTHER PUBLICATIONS

C. H. Seaman, "Calibration of Solar Cells by the Reference Cell Method-The Spectral Mismatch Problem", Solar Energy, vol. 29, No. 4, 1982, pp. 291-298.

Primary Examiner—Jerry Smith
Assistant Examiner—John R. Lastova
Attorney, Agent, or Firm—Cahill, Sutton & Thomas

[57] ABSTRACT

An apparatus including a white light and first, second, and third filters through which the white light is transmitted is utilized to sequentially irradiate a solar cell. The light impinging upon the solar cell from the first, second, and third filters has first, second, and third "tristimulus" distributions. The resulting first, second, and third electrical output quantities produced by the solar cell are measured and utilized to compute normalized spectral response coefficients by normalizing each of the electrical output quantities with respect to the sum of the three. First, second, and third response differences are obtained by subtracting the first, second, and third response coefficients from first, second and third response coefficients previously obtained from a reference solar cell. A spectral response mismatch coefficient equal to the square root of the squares of the three response differences is computed and utilized as a measure of the spectral response mismatch between the solar cell and the reference solar cell. On the basis of such computed spectral response mismatch coefficients, solar cells are grouped in ranges that are sufficiently closely matched to be optimally interconnected in individual solar modules. The technique can also be utilized to determine the spectral response of photovoltaic modules in terms of a tristimulus distribution, and the mismatch coefficient between the module and a solar cell and/or another module.

28 Claims, 7 Drawing Figures

METHOD AND APPARATUS FOR DETERMINING SPECTRAL RESPONSE AND SPECTRAL RESPONSE MISMATCH BETWEEN PHOTOVOLTAIC DEVICES

BACKGROUND OF THE INVENTION

The invention relates to apparatus and methods for determining the spectral response and the amount of spectral response mismatch between photovoltaic cells, and more particularly, to apparatus and methods for economically, rapidly, and automatically obtaining signals representative of the amount of spectral mismatch between photovoltaic solar cells, wherein problems associated with interconnecting mismatched solar cells together in a common panel are avoided.

It is well known in the photovoltaic solar collector industry that photovoltaic cells, hereinafter referred to simply as solar cells, that are connected in parallel and series relationships in a single solar collector panel need to have closely matched opto-electrical responses to the same spectral distributions, especially that of the sun. Several problems arise if one or more of the individual solar cells are mismatched with respect to the rest of the solar cells interconnected in a single panel. One problem is that if the individual solar cells are not closely matched, it becomes difficult, if not impossible, to specify rated electrical output characteristics for a solar collector panel within a satisfactorily narrow range of accuracy. Another problem is that if one solar cell in the collector panel produces a lower voltage output in response to irradiation by a particular illuminant, that solar cell will conduct more current than the others. This condition is referred to herein as "current hogging", and has several undesirable consequences, one being that the mismatched solar cell overheats, and the other being that the total output power produced by the solar collector panel is decreased. The localized overheating can degrade the reliability and lifetime of the solar collector panel in a number of ways. For example, the overheating of one solar cell may cause gradual darkening or discoloration of the encapsulant of that solar cell, thereby reducing the amount of radiation received by the solar cell's PN junction. As a result of reducing the amount of solar irradiation received by the PN junction, the electrical output thereof is also reduced.

It is also well known that standard reference cells should be spectrally matched to the cells and/or modules being evaluated for electrical performance. This method provides an accurate and simple means of defining the spectral response of any photovoltaic device in terms of two mathematical parameters.

Various techniques have been utilized in the past to characterize and determine the effective amount of "mismatch" between two solar cells. One technique is to illuminate one solar cell through a blue filter, measure the resulting output current, then illuminate that solar cell from the same source through a red filter, and then measure that output. (See Weizer, V. G., "Consideration of Design and Calibration of Terrestrial Reference Solar Cells", document No. NSAS CP-2010, Terrestrial Photovoltaic Measurements. II, Workshop Proceedings, Baton Rouge, La., Nov. 10-12, 1976.) The measured outputs then are ratioed to provide the "red-blue ratio" utilized in the industry to match cells, cells and modules, and modules with each other. If the ratios of corresponding solar cells or devices agree closely, the solar cell under test and the reference solar cell or other device are assumed to be very "closely matched". Unfortunately, this technique has proven to be highly inadequate. Solar irradiance changes a great deal, depending on the time of day, the season, and location on the earth. It has been found that solar cells which appear to be satisfactorily matched according to the above technique are, in fact, highly mismatched for other illuminants, such as the sun. Solar collector panels including individual solar cells that are determined to be matched in the foregoing manner are likely to have all of the abovementioned difficulties that result from use of mismatched devices.

Another proposed method for determining the amount of mismatch between a solar cell under test and a reference solar cell has been to compare the spectral response curves of the two cells or devices in question, one of which may be a reference standard. This is done by normalizing the spectral response curve of the test device to the reference device at 700 nanometer wavelengths. The difference between the integrated normalized spectral response curve of the test device and the integrated spectral response curve of the reference device is convoluted with the Air Mass 1.5 solar spectrum (see the ASTM Committee E44 Draft Document 105 "Terrestrial Direct Normal Solar Spectral Irradiance Tables for Air Mass 1.5", available from The American Society of Testing and Materials, 1916 Race Street, Philadelphia, Pa. 19103) to provide a mismatch parameter. Unfortunately, the evidence available leads to the conclusion that solar cells that are closely matched in accordance with this technique may actually be substantially mismatched in operational performance.

Therefore, there remains an unmet need for a simple method and apparatus for accurately generating a spectral response characterization and a single mismatch coefficient, and an electrical signal representative thereof, to accurately indicate spectral response and the effective amount of mismatch between two photovoltaic cells when they are irradiated by normally varying solar irradiation.

There is a need for such a device that is capable of inexpensive manufacture and utilization and which can be adapted for rapid classification of solar cells during manufacture thereof and sorting the solar cells into groups that are sufficiently closely matched for optimal interconnection in solar collector panels without causing the above-mentioned problems that arise when mismatched solar cells are interconnected in a single solar panel.

Accordingly, it is an object of the invention to provide a method and apparatus for rapid, relatively low cost, accurate determination of the amount of mismatch between two photovoltaic cells.

It is another object of the invention to provide a method and apparatus for rapid, low cost determination of the spectral response of a photovoltaic cell.

It is another object of the invention to provide a method and apparatus for producing a signal representative of the amount of mismatch between solar cells such that solar cells grouped in accordance with predetermined ranges of mismatch as indicated by the signal can be reliably and optimally interconnected in a single solar collector panel that is exposed to the normal range of solar irradiance.

It is another object of the invention to provide a method and apparatus for determining the spectral response of photovoltaic cells or devices in order to facilitate the correct selection of standard reference cells for the accurate assessment of solar irradiance values employed in determining the electrical performance of photovoltaic cells, modules, panels, etc.

It is another object of the invention to provide a method and apparatus for automatically sorting solar cells into closely matched groups during the manufacture of the solar cells.

It is another object of the invention to provide a single parametric description of the mismatch in spectral response between any two photovoltaic cells of the same generic type wherein the parametric description effectively indicates the amount of mismatch between the electrical responses to the two photovoltaic cells over the normal range of solar irradiance.

Users of color difference data have employed summations of three vector-like components of a difference into a single scale or value that is useful for determining whether a specimen color is within a specified tolerance from a standard. See the ASTM publication *"Standard Method for Instrumental Evaluation of Color Differences of Opaque Materials"*, ASTM Standard D2244, pages 415–422, part 27, Paint-, 1981 Annual Book of ASTM Standards, American Soceity of Testing and Materials. Although the technique has proven useful in characterizing color differences, it has never been adopted for use in characterizing differences in electrical characteristics of photovoltaic cells.

SUMMARY OF THE INVENTION

Briefly described, and in accordance with one embodiment thereof, the invention provides a method and apparatus for determining "tristimulus responses" of a photovoltaic cell to first, second, and third spectral distributions of irradiance, in effect integrating the tristimulus responses to obtain first, second, and third response coefficients, respectively, obtaining normalized first, second, and third response coefficients by dividing each of the first, second, and third response coefficients by the sum thereof, computing first, second and third response differences by subtracting said first, second, and third normalized response coefficients from corresponding normalized response coefficients previously obtained for a reference photovoltaic cell or provided as a reference standard, and computing a spectral mismatch coefficient that is equal to the square root of the sum of the squares of the first, second, and third response differences and is representative of the effective amount of mismatch between the response of the subject photovoltaic cell and the reference photovoltaic cell over the normal range of solar irradiance. In one embodiment of the invention, each integrating is done, in effect, by obtaining for each wavelength, the product of the intensity of a standard illuminant, the solar cell electrical output spectral response, and one of the normalized tristimulus responses of the solar cell, and then obtaining the sum of such products.

In another embodiment of the invention, an apparatus including a white light stimulant and first, second, and third filters is utilized to automatically produce first, second and third tristimulus irradiance distributions that are used to irradiate the photovoltaic cell presently being tested. A necessary condition of each of the filters is that the product of the spectral distribution of the artificial white light and of the filter transmittance must be equal to the product of the standard illuminant spectrum and the corresponding tristimulus response distribution of the first mentioned embodiment of the invention. First, secoond, and third electrical responses of that photovoltaic cell are measured by a current measuring device and converted to corresponding digital numbers for the first, second, and third filters, respectively. The digital numbers are input to a processor that computes first, second, and third normalized response coefficients, wherein each of the first, second, and third normalized response coefficients is equal to a corresponding one of the first, second, and third electrical responses divided by the sum of the first, second, and third electrical responses. In this embodiment of the invention, the processor includes a memory that stores a file of similar first, second, and third normalized response coefficients for a reference solar cell with which the subject solar cell being tested is to be compared. The processor then computes first, second, and third mismatch differences by subtracting the first, second, and third normalized coefficients for the solar cell being tested from the stored first, second and third normalized response coefficients, respectively, of the reference solar cell. The processor then computes a spectral response mismatch coefficient by computing the square root of the sum of the squares of the first, second, and third response differences. The spectral response mismatch coefficient then is utilized to classify and sort the solar cell being tested, wherein that solar cell is placed within one of a plurality of predetermined groups of solar cells that are sufficiently closely matched to permit optimal interconnection thereof in a single solar collector panel without causing the above-mentioned problems in rating the electrical output of the solar collector panel, and without reducing the electrical output or causing localized overheating due to interconnection of a mismatched solar cell.

DESCRIPTION OF THE INVENTION

In order to develop an accurate, single parameter description of the amount of "mismatch" between two photovoltaic silicon solar cells, the spectral response of an arbitrarily chosen "standard" or reference silicon solar cell was obtained. This solar cell was obtained from NASA, and its absolute spectral response, in milliamps per milliwatt, is shown by curve 1 in FIG. 2. This "standard" solar cell is referred to herein as the "S" cell or as the standard cell.

Figure 2:
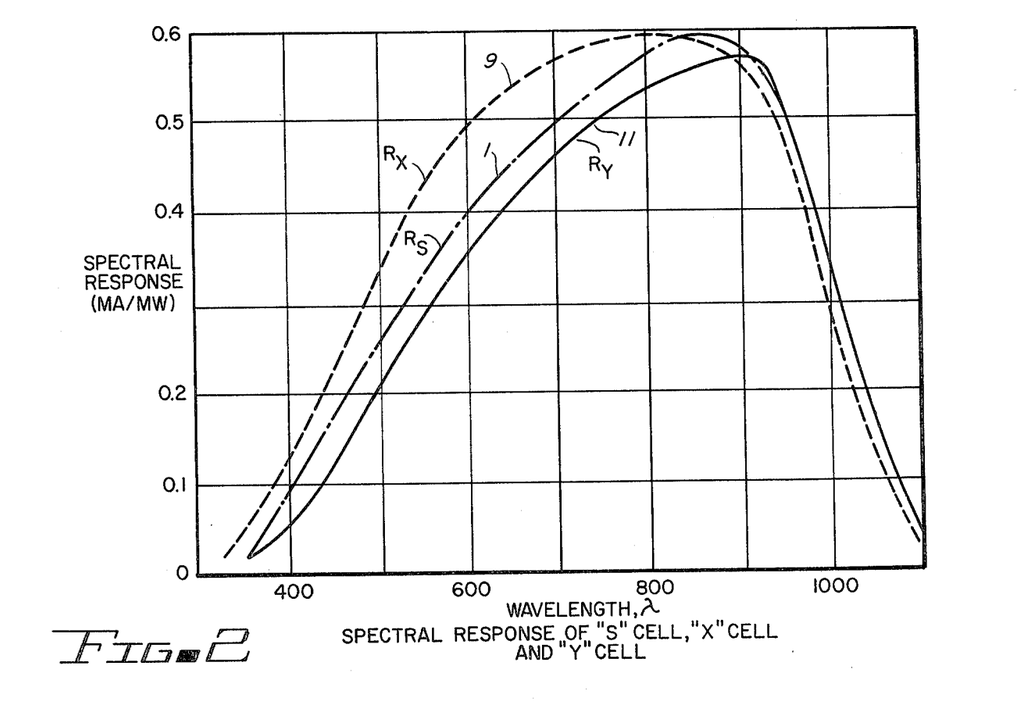
FIG. 2 is a graph of the absolute spectral response of the standard solar cell and two other solar cells whose mismatch coefficients relative to the standard solar cell and to each other are computed to illustrate the present invention.

The above-mentioned S solar cell is a silicon solar cell. Substantially different responses are obtained from other types of photovoltaic solar cells, such as gallium arsenide solar cells. The silicon solar cell has an output characteristic that has a relatively gentle rising slope and a relatively abrupt falling slope, as can be seen in FIG. 2. FIG. 2 also discloses the absolute spectral response curve 9 of another silicon solar cell, referred to herein as the "X" cell, and the absolute spectral response curve 11 of a third silicon solar cell referred to as the "Y" cell. The responses of these three solar cells are used in the following explanation of the invention, wherein the relative amounts of mismatch between the three solar cells are computed and used to classify solar cells.

Figure 1:
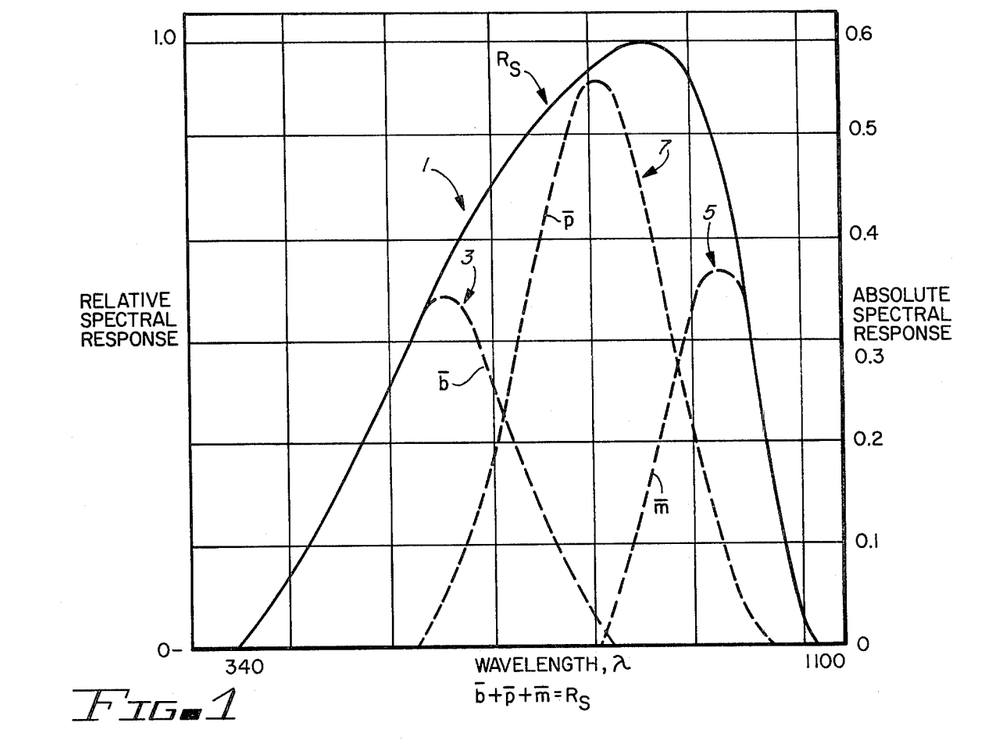
FIG. 1 is a graph showing the relative spectral response of a "standard" or reference silicon solar cell and three arbitrary tristimulus response distributions that are components of the relative spectral response.

In accordance with the present invention, the spectral response curve of each solar cell is considered to be composed of various amounts of the additive component standard tristimulus curves, the sum of which equals the "total" spectral response curve of that solar cell. (It will be appreciated by those skilled in the art that the spectral response of a photovoltaic cell is a fixed characteristic of that cell and is independent of the illuminant. The spectral response curve simply indicates how much current the cell can generate from light energy at each wave length thereof.) It is known that light intensities at each frequency add and that any light spectra can be divided into component spectra. In accordance with the present invention, the $R_S$ spectral response curve 1 is divided into three arbitrary standard tristimulus component spectra, as shown in FIG. 1. Note that in FIG. 1, the left vertical scale indicates the relative spectral response, and the right vertical scale indicates the absolute spectral response.

Still referring to FIG. 1, the three component spectra mentioned above are designated by reference numerals 3, 5 and 7. These three curves are referred to hereinafter as the "tristimulus response distributions" of the standard solar cell. It can be seen that curves 3 and 5 of FIG. 1 overlap. Therefore, at each wavelength, the sum of the ordinates of tristimulus response curves 3, 5 and 7 are equal to the ordinate of the $R_S$ curve 1. The curve 3, referred to hereinafter as the OVS/b/ curve, is selected so that its rising slope concides with the lower portion of the rising slope of $R_S$ curve 1. The falling slope of curve 5, hereinafter referred to as the OVS/m/ curve, is chosen so that its falling slope coincides with the lower portion of the falling slope of $R_S$ curve 1. Since curves 3 and 5 overlap to some extent, the ordinates of curve 7, hereinafter referred to as the OVS/p/ curve, can be obtained by subtracting the sum of the ordinates of curves 3 and 5 from the corresponding ordinate of $R_S$ curve 1, at each wavelength. The fact that at each wavelength the value of $R_S$ is equal to the sum of the values of OVS/b/, OVS/p/, and OVS/m/ is mathematically expressed by the equation $$\Sigma_\lambda R_S = \Sigma_\lambda b + \Sigma_\lambda p + \Sigma_\lambda m.$$

Since the OVS/b/ curve lies in the portion of the visible spectrum containing blue colors, the letter "b" (blue) is used to designate OVS/b/ curve 3. Similarly, the letter "m" (magenta) is used to describe curve 5 since curve 5 lies in the portion of the visible spectrum containing magenta (or red) colors. The "blue" and "magenta" wavelengths are those for which the spectral response of a silicon solar cell is most sensitive or variable as a function of various parameters. The spectrum of wavelengths of curve 7 lies in the range in which most of the output power of the silicon solar cell is produced; hence, the use of the letter "p" (power) to designate curve 7. As mentioned above, the OVS/b/, OVS/m/, and OVS/p/ responses of a solar cell are referred to as the tristimulus responses.

Since the electrical output of a photovoltaic cell having a given absolute spectral response (in units of milliamperes per milliwatt per square centimeter) is a function of the spectral distribution (in units of milliwatts per square centimeter) of the illuminating source (whether natural sunlight or an artificial source), it is necessary to reference all computations of spectral response and response mismatch to a standard source of spectral irradiance. Proposed ASTM standards for spectral distributions of terrestrial global and direct beam solar irradiance can be conveniently used as such a standard source of spectral irradiance. See the above-mentioned ASTM Committee E44 Draft Document 105 and also see the ASTM Draft Document 138R4 "Terrestrial Solar Spectral Irradiance Table at Air Mass 1.5 for a 37° Tilted Surface." For flat-plate photovoltaic applications, the source spectra given in the ASTM Draft Document 138R4 can be used, and for concentrator applications, the direct beam reference spectra of the ASTM Draft Document 105 can be used.

Table 1, attached hereto, contains data representing the spectral response ordinates of the OVS/b/, OVS/m/, and OVS/p/ curves of FIG. 2. The second column of Table I, headed by "$I_{1.5}$", represents the intensity of the above mentioned Standard Global Solar Spectrum for Air Mass 1.5 used as a source or illuminant to cause the above-mentioned S, X and Y solar cells to generate output currents. In accordance with the present invention, at each wavelength, the value of the intensity of the solar irradiance, i.e., $I_{1.5}$, is multiplied by the corresponding values of OVS/b/, OVS/p/, and OVS/m/, respectively, to obtain the values shown in the three right hand columns of Table 1 headed "OVS/b/ .$I_{1.5}$", "OVS/m/ .$I_{1.5}$", and "OVS/p/ .$I_{1.5}$", respectively.

At each value of wavelength $\lambda$, the corresponding value of $R_S$ (the absolute spectral response of the standard silicon cell taken from curve 1 in FIG. 2) is also shown in Table 1. Note that in FIG. 1, the left hand vertical axis provides "normalized" ordinates, i.e., the relative spectral response, represented by the curve shown, while the right hand vertical axis indicates the absolute spectral response. The absolute spectral response ordinants for the OVS/b/, OVS/m/ and OVS/p/ curves in FIG. 1 are shown in the columns headed "OVS/b/ ", "OVS/m/ ", "OVS/p/ " in Table 1.

Before describing how the products in the three right hand columns of Table 1 are used, it will be helpful to first describe, by means of formulas, the computations to be made in order to obtain a spectral response and a spectral response mismatch coefficient in accordance with the present invention. For purposes of designating variables in the following equations, the solar cell which produces the spectral response $R_S$ designated by curve 1 in FIG. 2 is referred to as the "standard" or "S" cell. Similarly, the other two solar cells which produce the spectral responses $R_X$ and $R_Y$ designated by curves 9 and 11, respectively, in FIG. 2 are referred to as the "X" solar cell and the "Y" solar cell, respectively.

In accordance with the present invention, the three following expressions represent "response coefficients" of a solar cell to the Air Mass 1.5 solar distribution that is convoluted with the OVS/b/ (blue), OVS/m/ (magenta) and OVS/p/ (power) tristimulus components of the standard reference cell response $R_S$:

$$B = \Sigma_\lambda\, I_{1.5}\bar{b}R, \text{ (blue response coefficient)}; \quad (1)$$

$$P = \Sigma_\lambda\, I_{1.5}\bar{m}R, \text{ (magenta or red response coefficient); and} \quad (2)$$

$$M = \Sigma_\lambda\, I_{1.5}\bar{p}R, \text{ (power response coefficient)}. \quad (3)$$

At this point, it should be nted that the tristimulus response coefficients represent fractional components of the total cell output when it is illuminated by the appropriate Air Mass 1.5 spectrum and that the "complete" expression for B is actually $$B \propto \frac{\Sigma_\lambda I_{1.5}\bar{b}R}{\Sigma_\lambda R_S} = I_{SC_b}$$

where $I_{SC_b}$ is the short circuit output current generated by the solar cell being irradiated by the "OVS/b/" component of $I_{1.5}$ source. Similar expressions, (not shown) give the quantities P and M, and similarly relate $I_{SC_p}$ and $I_{SC_m}$ to P and M, respectively. However, for our purposes, the "incomplete" expressions (1), (2) and (3) without the denominator term can be used to compute the "normalized" response coefficients of equations (4), (5) and (6), subsequently described, because the denominator term obviously cancels out during the computation.

It can now be seen how the products in the three right hand columns of Table 1 are useful in computing the summations in equations (1) through (3). To this end, the produce OVS/b/ .$I_{1.5}$ is given in Table 2 along with values of λ wavelength for which OVS/b/ is significant. Values of $R_S$, $R_X$, and $R_Y$ are also given, so that the results required by equations (1), (2) and (3) can be obtained for each of the S, X and Y solar cells. The resulting values of B, namely $B_S$, $B_X$ and $B_Y$, are indicated in Table 2.

Similarly, the summations required by equation (2) for the S, X and Y solar cells are shown in Table 3, and the summations required by equation (3) for the S, X, and Y solar cells are shown in Table 4.

Next, for each of the S, X, and Y solar cells, "normalized response coefficients" are computed in accordance with the following expressions.

$$b = \frac{B}{B+P+M} \text{ (normalized blue response coefficient)} \quad (4)$$

$$= \frac{I_{SC_b}}{I_{SC_b} + I_{SC_p} + I_{SC_m}}$$

$$m = \frac{M}{B+P+M} \text{ (normalized magenta response coefficient)} \quad (5)$$

$$= \frac{I_{SC_m}}{I_{SC_b} + I_{SC_p} + I_{SC_m}}$$

$$p = \frac{P}{B+P+M} \text{ (normalized power response coefficient)} \quad (6)$$

$$= \frac{I_{SC_p}}{I_{SC_b} + I_{SC_p} + I_{SC_m}}$$

It can be easily seen that $b+m+p=1$, and that the spectral response of any cell is described by any pair of the normalized response coefficients b, m, and p. Because the solar cell response is most sensitive to source spectral differences in the blue and magenta (red) regions, it will be most convenient to describe the spectral response of photovoltaic cells in terms of b and m.

Table 5 shows the results of the computations of equations (4) through (6) for the S, X, and Y cells.

Once all of the above normalized response coefficients have been computed, values of spectral response differences may be determined as follows:

$$\Delta b_{ij} = b_i - b_j \text{(blue response difference between } i \text{ and } j \text{ solar cells)}: \quad (7)$$

$$\Delta m_{ij} = m_i - m_j \text{ (magenta response difference between the} \quad (8)$$

ith and jth solar cells);

$$\Delta p_{ij} = p_i - p_j \text{ (power response difference between the} \quad (9)$$

ith and jth solar cells).

The first three columns of Table 6 show the results of computations in accordance with the three foregoing equations for the response difference between the S and X solar cells, the S and Y solar cells, and the X and Y solar cells, respectively.

Finally, the spectral response mismatch coefficient is computed according to equation:

$$\Delta R = \sqrt{\Delta b^2 + \Delta p^2 + \Delta m^2} \text{ (spectral response mismatch coefficient)} \quad (10)$$

which, in accordance with the present invention, is a single parameter that accurately indicates the effective amount of mismatch between two photovoltaic cells over the entire range of wavelengths wherein a significant amount of power is generated by a silicon solar cell. The values of $\Delta R$ computed in accordance with equation (10) are also shown in the right hand column of Table 6 for the S, X, and Y solar cells.

As mentioned above, equation (10) provides an accurate measure of the amount of effective mismatch between two photovoltaic cells that are being "compared" to each other in the manner previously described. However, when two photovoltaic cells are to be compared with each other by using the results obtained by comparing each with a standard reference cell, equation (10) must be modified. In this case, the following equation is used:

$$\Delta R = \sqrt{(\Delta b_i - \Delta b_j)^2 + (\Delta p_i - \Delta p_j)^2 + (\Delta m_i - \Delta m_j)^2} \quad (11)$$

where
  $\Delta b_i = b_s - b_i$ (blue response difference between standard solar cell and ith solar cell)
  $\Delta b_j = b_s - b_j$ (blue response difference between standard solar cell and jth solar cell)
  $\Delta p_i = p_s - p_i$ (power response difference between standard solar cell and ith solar cell)
  $\Delta p_j = p_s - p_j$ (power response difference between standard solar cell and jth solar cell)
  $\Delta m_i = m_s - m_i$ (magenta response difference between standard solar cell and ith solar cell)
  $\Delta m_j = m_s - m_j$ (magenta response diffestandard solar cell and jth solar cell)

Figure 3:
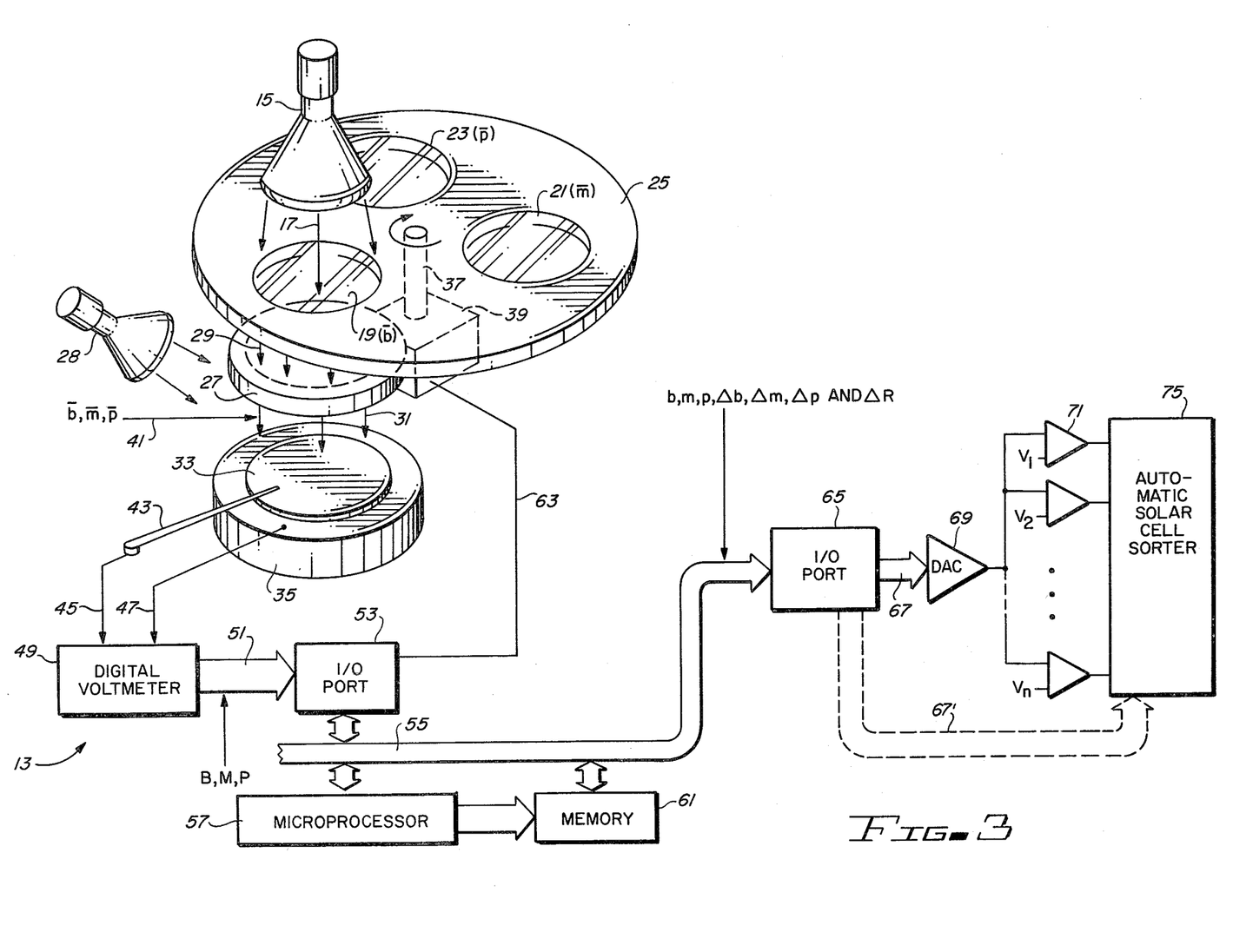
FIG. 3 is a partial perspective schematic drawing of a preferred embodiment of the invention.

In accordance with a presently preferred embodiment of the invention, the computations represented by expressions (1), (2) and (3) are not actually made at selected frequencies in the manner indicated in the foregoing discussion and tables, but instead are automatically accomplished by an apparatus which effects the summations or integrations represented by expressions (1), (2) and (3). Referring now to FIG. 3, apparatus 13 performs the function of irradiating a silicon solar cell 33 that is held in place on a conductive vacuum chuck 35. Apparatus 13 includes a lamp 15, which can include one or more 250 to 300 watt dichroic projector lamps of the type commonly utilized in Kodak carousel projectors, typically having ENH or ELH designations. Lamp 15 produces white light designated by reference numeral 17. Three filters 19, 21, and 23, referred to as the OVS/b/, OVS/m/, and OVS/p/ filters, respectively, are disposed on a three-position filter wheel 25 that is rotated by a mechanism 39 to three indexed positions wherein the three filters 19, 21 and 23 are successively aligned with white light 17 from lamp 15.

The three filters 19, 21 and 23 are constructed to respectively have first, second, and third spectral transmittance distributions such that the spectral distributions of the light emerging from the lower surfaces of filters 19, 21 and 23 are respectively equal to the products of the standard illuminant spectrum and the first, second, and third tristimulus spectral transmittance distributions OVS/b/, OVS/p/, and OVS/m/. Furthermore, the magnitude of the first, second, and third spectral transmittance distributions are respectively equal to the magnitude of the OVS/b/, OVS/p/, and OVS/m/ tristimulus response distributions of the standard S cell. OVS/b/, OVS/p/, and OVS/m/ can each be thought of as the product of the transmittance of a respective one of filters 19, 21 and 23 and the intensity of the illuminant. Such filters can be constructed as single element filters, although it is difficult to construct them as single element filters. Filters 3, 5 and 7 each can be more easily constructed of several individual elements, including a "cut-on" element that determines the rising slope of the S cell and a "cut-off" element that determines the falling slope of the S solar cell.

If necessary, an additional focusing lens 27 is provided so that the intensity of irradiation on the surface of silicon solar cell 33 is uniform. This would be necessary if silicon solar cell 33 is sufficiently large that there would be an appreciable variation in the intensity of light falling thereon directly from the lower side of the filters 19, 21 and 23.

In FIG. 3, reference numeral 28 designates a "white bias light" source, which might be needed if the intensity of lamp 15 is relatively low in order to "bias" solar cell 33 into a linear portion of its characteristic before light from lamp 15 impinges thereon. If this is done, it is necessary to "chop" both the monochromatic, or filtered, light and the resulting output signal of solar cell 33 and process the chopped signal in order to distinguish the portion of the electrical output that is produced in response to lamp 15 from the portion of the output that is produced in response to bias lamp 28.

Reference numeral 43 designates an electrical probe that contacts metalization on the upper surface of solar cell 33. Conductive probe 43 is connected by conductor 45 to an output of digital voltmeter 49. Another input of digital voltmeter 49 is electrically connected to the conductive vacuum pedestal or chuck 35, which electrically contacts the backside of solar cell 33. Digital voltmeter 49 is connected in a conventional fashion across a low value shunt resistor so that the digital voltmeter reading represents the short circuit output current $I_{SC}$ of the solar cell 33.

Digital voltmeter 49 thus measures the voltage output of solar cell 33 and produces a digital number representative of the short circuit current output of solar cell 33 on bus 51. Bus 51 is connected to input ports of an input/output peripheral device 53. Input/output peripheral device 53 has terminals connected to a bi-directional data bus 55 that is connected to the data terminals of microprocessor 57 and memory 61. Those skilled in the art can readily provide peripheral adaptor circuitry for use in conjunction with commercially available microprocessors. For example, microprocessor 57 can be implemented by means of a Motorola MC6800, memory 61 can be augmented by means of static random access memories widely available in the semiconductor industry, and the input/output interface circuits such as 53 and 65 in FIG. 3 can be readily implemented utilizing Motorola MC6820 peripheral interface adaptor integrated circuits.

Input/output interface circuit 65 is also connected to bi-directional data bus 55, and produces output signals on conductors 67 which are applied to the input of a digital-to-analog converter 69. A wide variety of integrated circuit digital-to-analog converters (DACs) are widely available from such suppliers as Analog Devices, Inc., and Burr-Brown Research Corporation. The analog input of digital-to-analog converter 69 is connected to the common inputs of a group of comparators indicated by reference numeral 71. The outputs of comparators 71 are applied to a sorting machine that causes the tested silicon solar cells to be placed in groups of solar cells that are sufficiently closely matched, in accordance with the criteria developed above, or as modified by the flow chart of FIGS. 4A-4D, to enable all of the solar cells in each such group to be interconnected with others in that group into a single solar panel without the previously described problems that are caused by interconnection of severely mismatched solar cells.

Conductor 63 connects an output port of input/output peripheral circuit 53 to a control input of device 39, which causes rotation and indexing of the desired ones of filters 19, 21 and 23 with lamp 15.

The characteristics required for the three filters 19, 21 and 23 to produce these distributions from the irradiance produced by lamp 15 can be empirically obtained with the aid of a spectroradiometer, which measures the intensity of light emerging from the filter at each desired wavelength.

In operation, each solar cell to be tested is irradiated by lamp 15 through each of three filters 19, 21, and 23, one at a time, and corresponding measurements of the short circuit response current produced by that solar cell are obtained by means of digital voltmeter 49. If desired, multiple measurements can be taken to obtain three statistical or average responses for illumination through each of the three respective filters. In any case, the three measurements correspond to the values of B, M, and P given by equations (1), (2), and (3). In accordance with equations (4), (5), and (6), B, M, and P are normalized to produce b, m, and p, which will be identical to the values computed in accordance with Tables 1-6 from the actual absolute spectral response curves.

Microprocessor 57 then computes the response differences $\Delta b$, $\Delta m$, and $\Delta p$ for the solar cell presently being tested by performing the above subtraction operations by subtracting the b, m and p values computed for the solar cell presently being tested from corresponding reference solar cell values stored in memory 61. Microprocessor 57 then utilizes equation (10) to compute $\Delta R$, which is the spectral response mismatch coefficient between the solar cell presently being tested and the solar cell whose normalized response coefficients are stored in memory 61.

In accordance with another aspect of the present invention, the value of ΔR computed is output via bi-directional data bus 55 and input/output port 65 to digital-to-analog converter 69. The comparators 71 each have a different input threshold level. The differences between the threshold levels represent ranges. Solar cells having a ΔR within any particular range are considered to be sufficiently closely matched that they can be interconnected in a single solar panel without the previously mentioned disadvantages that arise when mismatched solar cells are interconnected.

Alternatively, digital-to-analog converter 69 and comparators 71 could be omitted, and instead, microprocessor 57 could perform the classification function by means of suitable software and then generate sorting or selection signals which could be output via input/output port 65 to automatic sorter 75, instructing it which group the presently tested solar cell should be included in.

FIGS. 4A to 4D include a flow chart describing the program executed by microprocessor 57 to convert the digital data received from voltmeter 49 to ΔR for the device presently being tested.

Figure 4A:
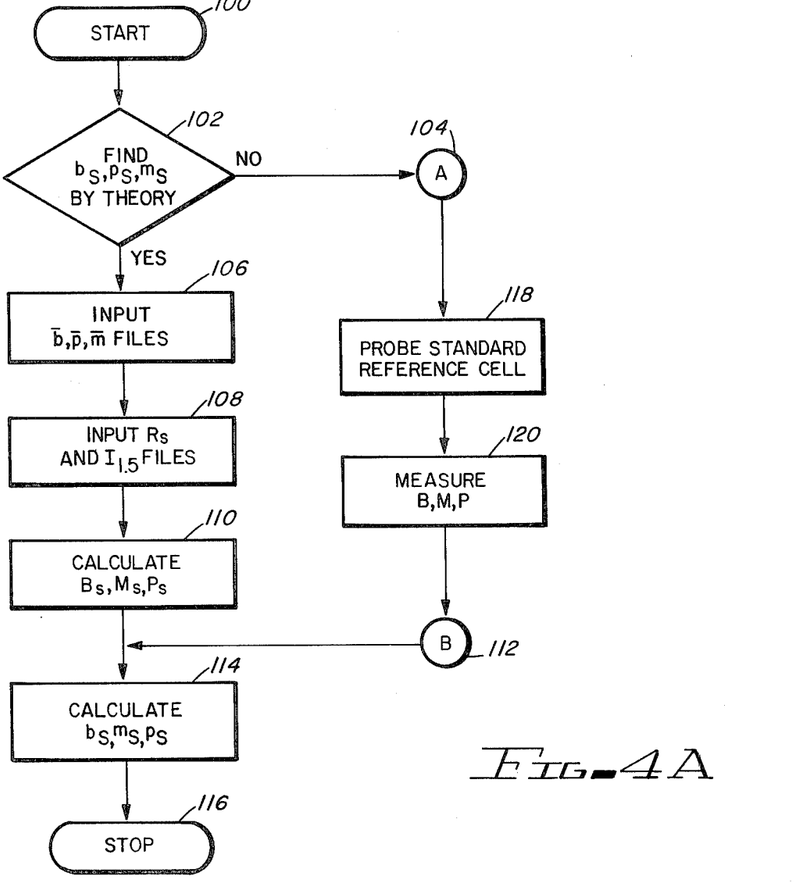
FIGS. 4A–4D constitute a flow chart of a program that can be executed by a microprocessor system such as the one shown in FIG. 3 to compute a mismatch coefficient in accordance with the present invention.

FIG. 4A shows a flow chart of the operations performed by microprocessor 57 of FIG. 3 to establish the S cell or standard cell parameters $b_s$, $p_s$ and $m_s$ required for the computation of equation 11. The subroutine starts at label 100, and enters decision block 102. In decision block 102, the program determines whether or not the normalized response coefficients $b_s$, $p_s$ and $m_s$ are to be determined "by theory" (or by actual measurement of the S cell). If this determination is negative, the program enters block 118 via label 104 to begin the necessary steps for determining $b_s$, $p_s$ and $m_s$ from measurements of the S (standard) cell. In block 118, microprocessor 57 executes a subroutine that causes filter wheel 25 to align filter 19 with lamp 15 so that filtered light 29 passes through focusing lens 27 to produce light 31 that strikes the top of solar cell 33, which in this case is the S cell. This light causes the S cell to produce a current through leads 45 and 47, which are connected to an input circuit of digital voltmeter 49. As previously explained, a precision resistor is connected in shunt with the input of digital voltmeter 49, which measures the voltage across the precision resistor. Hence, the digital voltmeter output represents the short circuit current $I_{SC_b}$. As previously explained, this quantity represents and is proprotional to the "blue response coefficient" of equation (1) above. The subroutine of block 120 causes microprocessor 57 to read and store the output $I_{SC_b}$ of digital voltmeter 49 produced on bus 51 via input/output port 53. The subroutine of block 120 then causes microprocessor 57 to generate a signal on bus 63 via input/output port 53 to cause filter wheel 25 to rotate so that filter 21 (the OVS/m/ filter) is now aligned with lamp 15. The short circuit current $I_{SC_m}$ then produced by the S cell through conductors 45 and 47 is read by digital voltmeter 49, which produces a number on bus 51 representative of $I_{SC_m}$, which, as explained above, is proportional to M of equation (3). Again, microprocessor 57 reads and stores this quantity and then repeats the procedure for filter 21, which is the OVS/p/ filter. In the same manner as described above, microprocessor 57 reads and stores the resulting value of $I_{SC_p}$, which represents P of equation (3).

Note that the S (standard) cell ordinarily would be an internationally agreed-upon reference cell for the particular kind of material of which cells to be matched are composed.

After microprocessor 57 has completed execution of the subroutine of block 120, the program enters block 114 via label 112 and computes the normalized response coefficients $b_s$, $m_s$, and $p_s$ (the normalized blue, magenta, and power response coefficients for the S cell) by means of equations (4), (5), and (6). The program then exits the subroutine of FIG. 4A via label 116.

If the determination of decision block 102 is afirmative, it is necessary to compute $b_s$, $p_s$, and $m_s$ "by theory", and the program enters subroutine 106. In this case, it is necessary that the data constituting the tristimulus spectral response characteristics of the above mentioned OVS/b/, OVS/m/, and OVS/p/ curves, 3, 5 and 7, respectively (see FIG. 1) of the S cell be stored in memory 61. This data could, for example, be the data in the OVS/b/, OVS/m/, and OVS/p/ columns of Table 1. (It should be noted that those skilled in the art can readily provide a wide variety of computer subroutines to accomplish storing such files in a memory, accessing them by means of microprocessor 57, reading information from and writing information into desired memory locations and input/output devices, and performing ordinary mathematical operations, etc. A detailed list of instructions to implement the flow chart for a particular microprocessor system therefore is not included.)

It should be again noted that the OVS/b/, OVS/p/, and OVS/m/ characteristics are in essence equivalent to the transmittance characteristics of filters 19, 23 and 21, respectively, of FIG. 3.

Next, the program enters block 108 of FIG. 4A and executes a subroutine to load the $R_S$ and $I_{1.5}$ files corresponding, for example, to the data in the $I_{1.5}$ and $R_S$ columns in Table 1 into memory 61, wherein it can be rapidly accessed by microprocessor 57. Normally, the files referred to in blocks 106 and 108 of FIG. 4A will be stored in a magnetic disc or magnetic tape. The program then enters block 110 and executes a subroutine to compute $B_s$, $M_s$, and $P_s$ precisely in accordance with equations (1), (3), and (2) by computing the various intermediate products shown in the three right hand columns of Table 1 and in the columns of Tables 2, 3, and 4 that are totalled to provide the values of $B_s$, $M_s$, and $P_s$, respectively. The program then enters block 114 and executes a subroutine to calculate normalized response coefficients $b_s$, $m_s$, and $p_s$ according to equations (4), (5), and (6), respectively. The program then exits the subroutine of FIG. 4A via label 116.

Figure 4B:
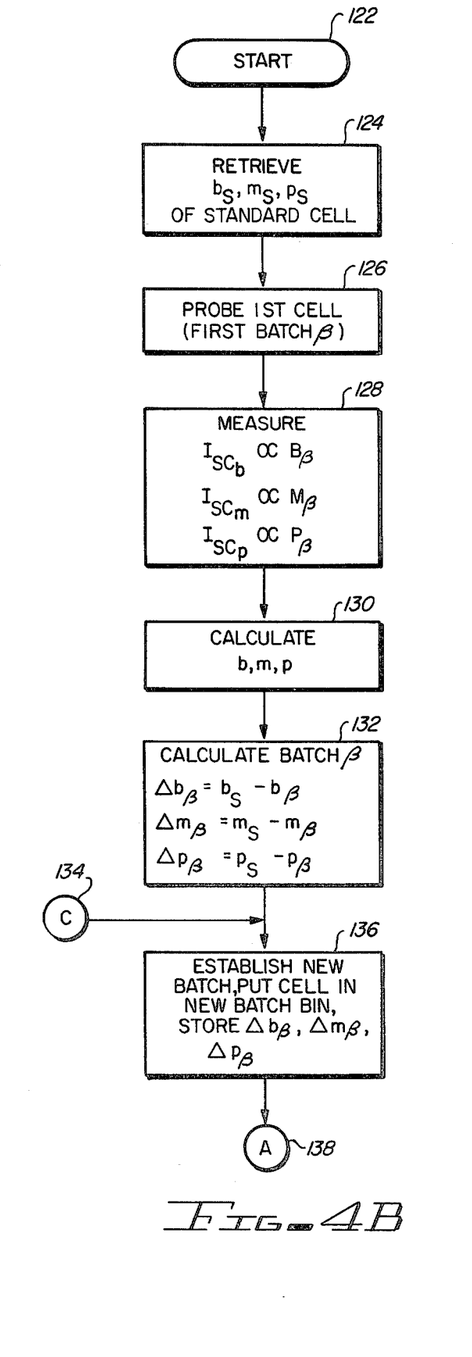
Figure 4C:
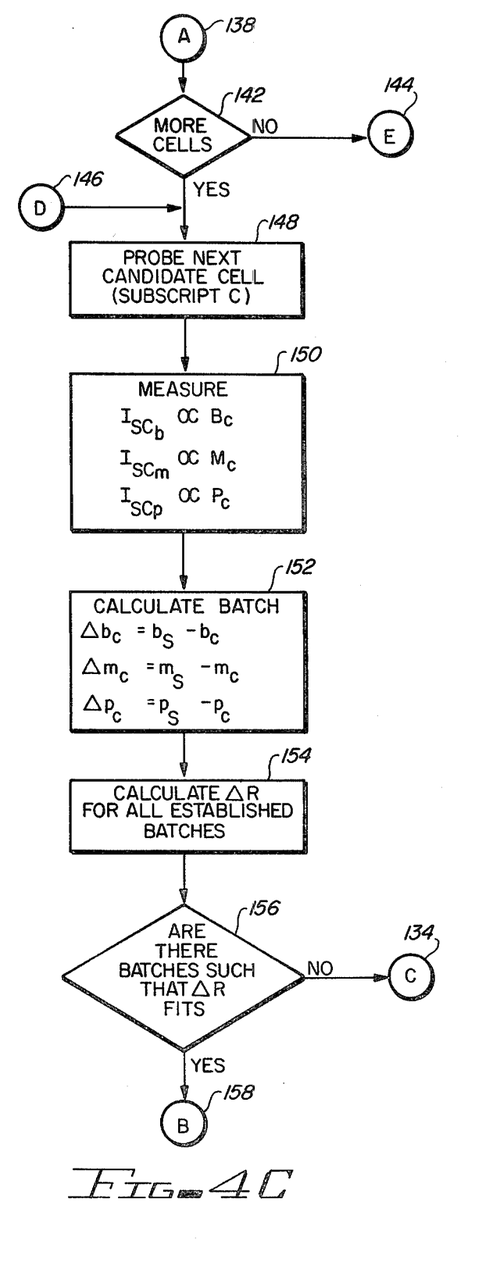
Figure 4D:
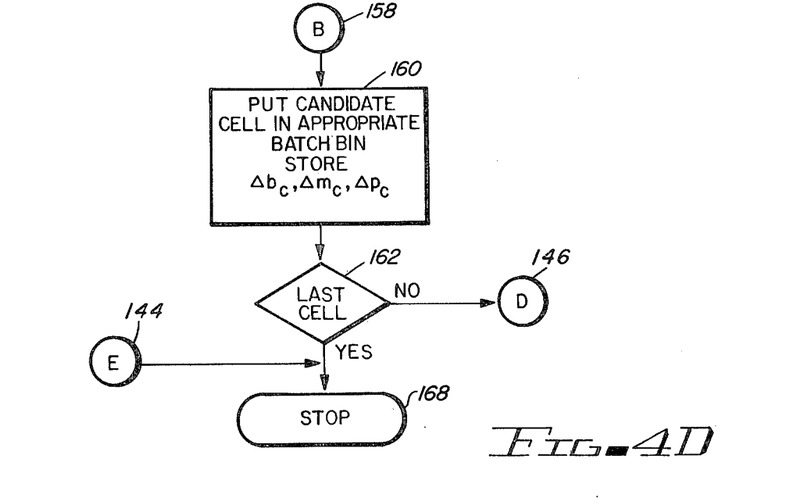

Once the necessary S cell normalized response coefficients $b_s$, $p_s$, and $m_s$ are available to microprocessor 57, the system of FIG. 3 is ready to begin testing and sorting solar cells. FIGS. 4B-4D show a flowchart of the operations performed by microprocessor 57 in order to accomplish such matching and sorting operations. The program is entered via label 122 of FIG. 4B and proceeds to block 124, which represents a subroutine wherein microprocessor 57 fetches $b_s$, $m_s$, and $p_s$, which were stored in memory 61 as soon as they are obtained in accordance with the subroutine of block 114 of FIG. 4A.

The program then goes to block 126 wherein microprocessor 57 causes the first solar cell (which in this instance is respresented by reference numeral 33 in FIG. 3) to be probed so that its short circuit output currents are successively measured by digital voltmeter 49 in response to illumination of the first cell by lamp 15 through filters 19, 21, and 23. As indicated in block 128, the program causes microprocessor 57 to read the quantities $I_{SC_b} \propto B$, $I_{SC_m} \propto M$, and $I_{SC_p} \propto P$. These values of short circuit output current are then utilized in block 130 to calculate the normalized response coefficients b, m, and p for the subject first solar cell using equations (4), (5), and (6), respectively. In the present example, the normalized response coefficients of cells from the $\beta$ batch are designated by the subscript $\beta$. Thus, the values of b, m, and p computed in block 130 can be considered to have $\beta$ as a subscript.

The program then enters block 132 and computes the quantities $\Delta b$, $\Delta m$, and $\Delta p$ for the first cell of the $\beta$ batch using the already available S (standard) cell parameters $b_S$, $m_S$, and $p_S$. At this point, it should be recognized that there is still not enough information available to calculate $\Delta R$ in accordance with equation (11) above, which is used if it is desired to determine the amount of mismatch $\Delta R$ between a representative cell of the $\beta$ batch and a third cell of the $\beta$ batch. Therefore, in block 136 the program causes microprocessor 57 to store the normalized spectral response "difference" between the first cell of the $\beta$ batch and the S cell.

The purpose of determining the amount of mismatch $\Delta R$ between the various cells of the $\beta$ batch and the S cell is to facilitate sorting of closely-matched cells into groups that then are put into corresponding "batch pins". It is convenient to put the first cell of the $\beta$ batch into a first batch bin; this is done in accordance with block 136. Automatic equipment that is commercially available can be controlled by microprocessor 57 to accomplish automatic movement of the solar cells on vacuum chuck 35 of FIG. 3 to appropriate batch bins. It should be noted that the embodiment of the invention shown in FIG. 3 provides a cell sorter that utilizes comparator circuitry 71 (previously described) to automatically sort cells into separate batch bins on the basis of the computed values of $\Delta R$. Other types of cell sorters can operate on the basis of appropriate commands output by microprocessor 57 via port 65 to specify precisely which batch bin the present solar cell should be placed in. In the latter event, microprocessor 57, rather than comparator 71, makes the decision as to which batch bin the present solar cell should be placed in.

Next, the program enters decision block 142 of FIG. 4C via label 138 and determines if there are more cells to be matched. If this determination is negative, the program is exited via label 144 of FIG. 4C and label 168 of FIG. 4D. If there remain more cells to be matched, the program goes to block 148 and probes the next cell, which will be designated by the subscript "c" for convenience. The program then goes to block 150 of FIG. 4C and causes microprocessor 57 to read the indicated short circuit current values produced by the subject "c" cell as it is successively illuminated through filters 19, 21, and 23 of FIG. 3. These quantities are proportional to $B_c$, $M_c$, and $P_c$, which are then used to compute $b_c$, $m_c$, and $p_c$ in accordance with equations (4)–(7) and are used in block 152. In block 152, microprocessor 57 uses the indicated equations, which are also shown above in conjunction with equation (11), to compute spectral response differences between the S cell and the present "c" cell. The program then utilizes equation (11) to compute $\Delta R$ for all $\beta$ batches for which values of $b_\beta$, $m_\beta$, and $p_\beta$ have been computed in accordance with blocks 132 and 136.

It should be noted that in FIG. 3, reference numeral 67' designates an alternate bus between input/output port 65 and solar cell sorter 75. Bus 67' is utilized if solar cell sorter 75 requires specific digital commands from microprocessor 57 to identify the batch bin in which the present solar cell is to be placed. In this case, digital-to-analog converter 69 and comparator 71 are omitted. The flowchart of FIGS. 4B–4D applies to this case.

In block 152, the subscripts for use in equation (11) are different than those indicated for equation (11) as shown above. For clarity, equation (11) is repeated below as equation (11'), using subscripts that are consistent with those shown in the flowchart of FIGS. 4B–4D:

$$\Delta R = \sqrt{(\Delta b_\beta - \Delta b_c)^2 + (\Delta m_\beta - \Delta m_c)^2 + (\Delta p_\beta - \Delta p_c)^2} \quad (11')$$

Next, the program enters decision block 156 and determines if the value or values of $\Delta R$ fit within any of the new batches that have been previously established in accordance with block 136. If not, the program reenters block 136 of FIG. 4B via label 134, establishes a new batch and causes the present solar cell to be placed in a new batch bin corresponding to the newly established batch. If any of the $\Delta R$ values computed in block 154 fall within the limits associated with any of the already established batches, the program enters block 160 of FIG. 4D via label 158, and puts the present solar cell in the batch bin corresponding to the already established batch to which the most recently computed value of $\Delta R$ corresponds. In block 160, the subroutine also causes microprocessor 57 to store the values of $\Delta b_c$, $\Delta m_c$, and $\Delta p_c$ computed in block 152. The program then enters decision block 162 and determines if the solar cell most recently probed, tested, and categorized is the last cell. If so, the program is exited via label 168. If not, the program reenters block 148 of FIG. 4C via label 146, and repeats the above procedure for the next cell.

It should be noted that the values of $\Delta b_c$, $\Delta m_c$, and $\Delta p_c$ computed in block 152 and stored in block 160 actually represent the spectral response characteristic of the present cell, since these quantities simply represent the difference between the characteristics of the spectral response of the solar cell being tested and the S (standard) solar cell, whose spectral response characteristics $b_S$, $m_S$, and $p_S$ are already known.

It should be noted that the above equations for computing the spectral response mismatch coefficient $\Delta R$ should be used only to obtain a comparison between two photovoltaic cells that are composed of the same material, for example, silicon. The differences between the spectral responses of different "families" of photovoltaic cells, for example silicon solar cells and gallium arsenide solar cells, are sufficiently great that the foregoing techniques should not be expected to provide an accurate indication of the overall "mismatch" between a silicon solar cell and a gallium arsenide solar cell. A new standard set of "b", "p" and "m" normalized response coefficients should be obtained for each different family of photovoltaic cells wherein it is desirable to closely match individual cells with respect to their spectral responses.

For example, it is possible to produce the same results as the circuit of FIG. 3 by utilizing three separate light sources each of which produces one of the three necessary light beams as indicated by arrow 41 in FIG. 3 without the use of separate filters 19, 21, and 23. What is important is that the spectral distributions of the three beams of light impinging on the solar cell each has the respective characteristic that it is equal to the product of the standard illuminant spectrum and a respective one of the first, second, and third tristimulus spectral transmittance distributions OVS/b/ , OVS/p/ , and OVS/m/ , and that the magnitudes of the first, second, and third spectral transmittance distributions are respectively equal to the magnitudes of the OVS/b/ , OVS/p/ , and OVS/m/ tristimulus response distributions of the standard cell.

While the invention has been described with reference to a particular embodiment thereof, those skilled in the art will be able to make various modifications to the disclosed apparatus and method without departing from the true spirit and scope of the present invention.

TABLE 1

| λ | $I_{1.5}$ | $R_S$ | $\bar{b}$ | $\bar{m}$ | $\bar{p}$ | $\bar{b} \cdot I_{1.5}$ | $\bar{p} \cdot I_{1.5}$ | $\bar{m} \cdot I_{1.5}$ |
|---|---|---|---|---|---|---|---|---|
| 360 | 57.23 | .030 | .030 | — | — | 1.717 | — | — |
| 380 | 66.56 | .055 | .055 | — | — | 3.661 | — | — |
| 400 | 92.08 | .080 | .080 | — | — | 7.366 | — | — |
| 420 | 120.0 | .125 | .125 | — | — | 15.00 | — | — |
| 440 | 130.6 | .160 | .160 | — | — | 20.90 | — | — |
| 460 | 147.9 | .184 | .184 | — | — | 27.21 | — | — |
| 480 | 173.4 | .220 | .220 | — | — | 38.15 | — | — |
| 500 | 168.6 | .250 | .250 | — | — | 42.15 | — | — |

TABLE 1-continued

| λ | $I_{1.5}$ | $R_S$ | $\bar{b}$ | $\bar{m}$ | $\bar{p}$ | $\bar{b} \cdot I_{1.5}$ | $\bar{p} \cdot I_{1.5}$ | $\bar{m} \cdot I_{1.5}$ |
|---|---|---|---|---|---|---|---|---|
| 520 | 160.2 | .290 | .290 | — | — | 46.46 | — | — |
| 540 | 155.6 | .325 | .320 | — | .005 | 49.79 | 0.778 | — |
| 560 | 142.9 | .365 | .290 | — | .075 | 41.44 | 10.72 | — |
| 580 | 132.9 | .395 | .250 | — | .145 | 33.23 | 19.27 | — |
| 600 | 132.2 | .400 | .220 | — | .200 | 29.08 | 26.44 | — |
| 620 | 137.9 | .435 | .184 | — | .251 | 25.37 | 34.61 | — |
| 640 | 130.9 | .450 | .160 | — | .290 | 20.94 | 37.96 | — |
| 660 | 130.4 | .465 | .125 | — | .340 | 16.30 | 44.34 | — |
| 680 | 119.8 | .480 | .080 | — | .400 | 9.584 | 47.92 | — |
| 700 | 115.8 | .500 | .055 | — | .445 | 6.369 | 51.53 | — |
| 720 | 109.9 | .519 | .030 | — | .489 | 3.297 | 53.74 | — |
| 740 | 112.4 | .538 | — | — | .538 | — | 60.47 | — |
| 760 | 61.9 | .550 | — | — | .550 | — | 34.05 | — |
| 780 | 107.6 | .568 | — | — | .568 | — | 61.12 | — |
| 800 | 101.6 | .575 | — | .110 | .465 | — | 47.24 | 11.18 |
| 820 | 94.9 | .580 | — | .195 | .385 | — | 36.54 | 18.51 |
| 840 | 93.2 | .582 | — | .250 | .332 | — | 30.94 | 23.30 |
| 860 | 91.6 | .580 | — | .285 | .295 | — | 27.02 | 26.11 |
| 880 | 88.1 | .576 | — | .320 | .256 | — | 22.55 | 28.19 |
| 900 | 50.2 | .572 | — | .360 | .212 | — | 10.64 | 18.07 |
| 920 | 72.0 | .555 | — | .380 | .150 | — | 10.80 | 27.36 |
| 940 | 57.0 | .515 | — | .390 | .070 | — | 3.990 | 22.23 |
| 960 | 44.3 | .470 | — | .380 | .020 | — | 0.886 | 16.83 |
| 980 | 66.4 | .385 | — | .360 | — | — | — | 23.90 |
| 1000 | 74.8 | .325 | — | .320 | — | — | — | 23.94 |
| 1020 | 72.0 | .285 | — | .285 | — | — | — | 20.52 |
| 1040 | 69.0 | .250 | — | .250 | — | — | — | 17.25 |
| 1060 | 64.0 | .195 | — | .195 | — | — | — | 12.48 |
| 1080 | 50.0 | .110 | — | .110 | — | — | — | 5.50 |

TABLE 2

| λ | $\bar{b} \cdot I_{1.5}$ | $R_S$ | $R_S(\bar{b} \cdot I_{1.5})$ | $R_X$ | $R_X(\bar{b} \cdot I_{1.5})$ | $R_Y$ | $R_Y(\bar{b} \cdot I_{1.5})$ |
|---|---|---|---|---|---|---|---|
| 340 | — | — | — | .018 | — | .018 | — |
| 360 | 1.72 | .030 | 0.05 | .045 | 0.08 | .020 | 0.03 |
| 380 | 3.66 | .055 | 0.20 | .078 | 0.29 | .025 | 0.09 |
| 400 | 7.37 | .080 | 0.59 | .109 | 0.80 | .035 | 0.26 |
| 420 | 15.00 | .125 | 1.88 | .150 | 2.25 | .063 | 0.95 |
| 440 | 20.90 | .160 | 3.34 | .190 | 3.97 | .100 | 2.09 |
| 460 | 27.21 | .184 | 5.00 | .240 | 6.53 | .135 | 3.67 |
| 480 | 38.15 | .220 | 8.39 | .292 | 11.14 | .185 | 7.06 |
| 500 | 42.15 | .250 | 10.54 | .325 | 13.70 | .215 | 9.06 |
| 520 | 46.46 | .290 | 13.47 | .355 | 16.49 | .243 | 11.30 |
| 540 | 49.79 | .325 | 16.18 | .410 | 20.41 | .280 | 13.94 |
| 560 | 41.44 | .365 | 15.13 | .448 | 18.57 | .320 | 13.26 |
| 580 | 33.23 | .395 | 13.13 | .478 | 15.88 | .355 | 11.80 |
| 600 | 29.08 | .420 | 12.21 | .505 | 14.69 | .375 | 10.91 |
| 620 | 35.37 | .435 | 11.04 | .515 | 13.07 | .400 | 10.15 |
| 640 | 20.94 | .450 | 9.42 | .525 | 10.99 | .422 | 8.84 |
| 660 | 16.30 | .465 | 7.58 | .545 | 8.88 | .450 | 7.34 |
| 680 | 9.58 | .480 | 4.60 | .560 | 5.36 | .465 | 4.45 |
| 700 | 6.37 | .500 | 3.19 | .575 | 3.66 | .478 | 3.04 |
| 720 | 3.30 | .519 | 1.71 | .578 | 1.91 | .587 | 1.94 |
| 740 | — | .538 | — | .580 | — | .596 | — |
| | | | $B_S = 137.65$ | | $B_X = 168.67$ | | $B_Y = 120.18$ |

TABLE 3

| λ | $\bar{m} \cdot I_{1.5}$ | $R_S$ | $R_S(\bar{m} \cdot I_{1.5})$ | $R_X$ | $R_X(\bar{m} \cdot I_{1.5})$ | $R_Y$ | $R_Y(\bar{m} \cdot I_{1.5})$ |
|---|---|---|---|---|---|---|---|
| 780 | — | .568 | — | .583 | — | .514 | — |
| 800 | 11.18 | .575 | 6.43 | .584 | 6.53 | .524 | 5.86 |
| 820 | 18.51 | .580 | 10.74 | .583 | 10.79 | .537 | 9.94 |
| 840 | 23.30 | .582 | 13.56 | .582 | 13.56 | .550 | 12.82 |
| 860 | 26.11 | .580 | 15.14 | .578 | 15.09 | .563 | 14.70 |
| 880 | 28.19 | .576 | 16.24 | .570 | 16.07 | .575 | 16.21 |
| 900 | 18.07 | .572 | 10.34 | .555 | 10.03 | .572 | 10.34 |
| 920 | 27.36 | .555 | 15.18 | .520 | 14.23 | .555 | 15.18 |
| 940 | 22.23 | .515 | 11.45 | .490 | 10.89 | .515 | 11.45 |
| 960 | 16.83 | .470 | 7.91 | .430 | 7.24 | .470 | 7.91 |
| 980 | 23.90 | .385 | 9.20 | .345 | 8.25 | .385 | 9.20 |
| 1000 | 23.94 | .325 | 7.78 | .285 | 6.82 | .325 | 7.78 |
| 1020 | 20.52 | .285 | 5.84 | .240 | 4.92 | .285 | 5.84 |
| 1040 | 17.25 | .250 | 4.31 | .178 | 3.07 | .250 | 4.31 |
| 1060 | 12.48 | .195 | 2.43 | .100 | 1.25 | .195 | 2.43 |
| 1080 | 5.50 | .110 | 0.61 | .050 | 0.28 | .110 | 0.61 |

TABLE 3-continued

| λ | $m \cdot I_{1.5}$ | $R_S$ | $R_S (m \cdot I_{1.5})$ | $R_X$ | $R_X (m \cdot I_{1.5})$ | $R_Y$ | $R_Y (m \cdot I_{1.5})$ |
|---|---|---|---|---|---|---|---|
| 1100 | — | — | — | — | — | — | — |
| | | | $M_S = 137.16$ | | $M_X = 129.02$ | | $M_Y = 134.58$ |

TABLE 4

| λ | $\bar{p} \cdot I_{1.5}$ | $R_S$ | $R_S (\bar{p} \cdot I_{1.5})$ | $R_X$ | $R_X (\bar{p} \cdot I_{1.5})$ | $R_Y$ | $R_Y (\bar{p} \cdot I_{1.5})$ |
|---|---|---|---|---|---|---|---|
| 520 | — | .290 | — | .355 | — | .243 | — |
| 540 | 0.78 | .325 | 0.25 | .410 | 0.32 | .280 | 0.22 |
| 560 | 10.72 | .365 | 3.91 | .448 | 4.80 | .320 | 3.43 |
| 580 | 10.27 | .395 | 7.61 | .478 | 9.21 | .355 | 6.84 |
| 600 | 26.44 | .420 | 11.10 | .505 | 13.35 | .375 | 9.92 |
| 620 | 34.61 | .435 | 15.06 | .515 | 17.82 | .400 | 13.84 |
| 640 | 37.96 | .450 | 17.08 | .525 | 19.93 | .422 | 16.02 |
| 660 | 44.34 | .465 | 20.62 | .545 | 24.17 | .450 | 19.95 |
| 680 | 47.92 | .480 | 23.00 | .560 | 26.84 | .465 | 22.28 |
| 700 | 51.53 | .500 | 25.77 | .575 | 29.63 | .478 | 24.63 |
| 720 | 53.74 | .519 | 27.89 | .578 | 31.06 | .487 | 26.17 |
| 740 | 60.47 | .538 | 32.53 | .580 | 35.07 | .496 | 29.99 |
| 760 | 34.05 | .550 | 18.73 | .582 | 19.82 | .505 | 17.20 |
| 780 | 61.12 | .568 | 34.72 | .583 | 35.63 | .514 | 31.42 |
| 800 | 47.24 | .575 | 27.16 | .584 | 27.59 | .524 | 24.75 |
| 820 | 36.54 | .580 | 21.19 | .583 | 21.30 | .537 | 19.62 |
| 840 | 30.94 | .582 | 18.00 | .582 | 18.00 | .550 | 17.02 |
| 860 | 27.02 | .580 | 15.67 | .578 | 15.62 | .563 | 15.21 |
| 880 | 22.55 | .576 | 12.99 | .570 | 12.85 | .575 | 12.97 |
| 900 | 10.64 | .572 | 6.09 | .555 | 5.91 | .572 | 6.09 |
| 920 | 10.80 | .555 | 5.99 | .520 | 5.62 | .555 | 5.99 |
| 940 | 3.99 | .515 | 2.05 | .490 | 1.96 | .515 | 2.05 |
| 960 | 0.89 | .470 | 0.42 | .430 | 0.38 | .470 | 0.42 |
| 980 | — | .385 | — | .345 | — | .385 | — |
| | | | $P_S = 347.83$ | | $P_X = 376.25$ | | $P_Y = 325.94$ |

TABLE 5

| | b | p | m |
|---|---|---|---|
| S cell | 0.221 | 0.559 | 0.220 |
| X cell | 0.250 | 0.558 | 0.192 |
| Y cell | 0.207 | 0.561 | 0.232 |

TABLE 6

| | | Δb | Δp | Δm | ΔR |
|---|---|---|---|---|---|
| R-X | $R_S/Z_{01}$ | −0.029 | +.001 | +.028 | .040 |
| R-Y | $R_S/Z_{43}$ | +0.014 | −.002 | −.012 | .019 |
| X-Y | $Z_{01}/Z_{43}$ | +0.043 | −.003 | −.040 | .058 |

We claim:

1. A method for determining the amount of spectral response mismatch between first and second photovoltaic cells, said method comprising the steps of:
    (a) storing first, second and third normalized response coefficients corresponding to first, second, and third spectral response distributions of said first photovoltaic cell, the sum of said first, second and third spectral response distributions being equal to a total spectral response distribution of said first photovoltaic cell;
    (b) producing light for illumination of said second photovoltaic cell, said light having a predetermined spectral distribution;
    (c) sequentially filtering said light by means of a first filter, then by means of a second filter, and then by means of a third filter, to produce first, second, and third spectral distributions, respectively, on said second photovoltaic cell, and thereby causing said second photovoltaic cell to sequentially produce first, second, and third output currents, respectively;
    (d) measuring said first, second and third output currents as each of said first, second, and third output currents are sequentially produced and producing first, second, and third digital numbers respectively, representative of the magnitudes of said first, second, and third measured output currents;
    (e) computing fourth, fifth, and sixth normalized response coefficients from said first, second and third digital numbers;
    (f) computing first, second, and third response differences between said first and fourth normalized response coefficients, between said second and fifth normalized response coefficients, and between said third and sixth normalized response coefficients, respectively;
    (g) computing a spectral response mismatch coefficient by computing the square root of the sum of the squares of said first, second, and third response differences; and
    (h) producing a utilization signal representing said spectral response mismatch coefficient.

2. The method of claim 1 including causing first, second, and third spectral transmittance distributions of said first, second and third filters, respectively, to be such that the product of the sum of said first, second, and third spectral transmittance distributions with said predetermined spectral distribution of a particular light is equal to the magnitude of the sum of the products of said first, second, and third spectral response distributions of said first photovoltaic cell with said predetermined spectral distribution of said light produced in step (b).

3. The method of claim 2 wherein step (b) is performed by means of a lamp.

4. The method of claim 3 wherein said first, second, and third filters are disposed in a rotatable filter wheel, step (c) including rotating said filter wheel to align said first filter with said lamp during a first time period, to align said second filter with said lamp during a second time period that is exclusive of said first time period, and to align said third filter with said lamp during a third time period that is exclusive of said first and second time periods.

5. The method of claim 4 wherein said first and second photovoltaic cells are composed of silicon, said method including causing said first and third spectral distributions to be in the blue and magenta portions of the solar spectrum, respectively, the magnitude of a rising portion of said first spectral response distribution closely matching the magnitude of a rising portion of said predetermined spectral response distribution of said first photovoltaic cell, and the magnitude of a falling portion of said third spectral response distribution closely matching the magnitude of a falling portion of said predetermined spectral response distribution of said first photovoltaic cell.

6. The method of claim 5 wherein said first, second, and third output currents are short circuit output currents, and said measuring is performed by causing said short circuit output currents to flow through a resistor and utilizing a digital voltmeter device to measure the voltage across said resistor and produce said first, second, and third digital number.

7. The method of claim 6 including reading said first, second and third digital numbers by means of a microprocessor system, and wherein steps (e), (f) and (g) are performed by means of said microprocessor system.

8. The method of claim 7 wherein said fourth, fifth, and sixth normalized response coefficients are computed in accordance with the equations $$b_2 = \frac{I_{SC1}}{I_{SC1} + I_{SC2} + I_{SC3}},$$

$$p_2 = \frac{I_{SC2}}{I_{SC1} + I_{SC2} + I_{SC3}}, \text{ and}$$

$$m_2 = \frac{I_{SC3}}{I_{SC1} + I_{SC2} + I_{SC3}},$$

wherein $b_2$, $p_2$ and $m_2$ represent said fourth, fifth, and sixth normalized response coefficients, respectively, of said second photovoltaic cell and $I_{SC1}$, $I_{SC2}$, and $I_{SC3}$ represent said first, second, and third digital numbers, respectively.

9. The method of claim 8 wherein said first, second, and third response differences are computed in accordance with the equations $$\Delta b = b_1 - b_2, \Delta p = p_1 - p_2, \text{ and } \Delta m = m_1 - m_2,$$

wherein, $\Delta b$, $\Delta p$, and $\Delta m$ represent said first, second and third response differences, respectively, and $b_1$, $p_1$, and $m_1$ represent said first, second, and third normalized response coefficients, respectively.

10. The method of claim 9 including computing said spectral response mismatch coefficient in accordance with the equation $$\Delta R = \sqrt{(\Delta b)^2 + (\Delta p)^2 + (\Delta m)^2},$$

wherein $\Delta R$ represents said spectral response mismatch coefficient.

11. A method for determining the amount of spectral response mismatch between first and second photovoltaic cells, said method comprising the steps of:

(a) storing first, second and third normalized response coefficients corresponding to first, second, and third spectral response distributions of a reference photovoltaic cell, the sum of said first, second and third spectral response distributions being equal to a total spectral response distribution of said reference photovoltaic cell;

(b) producing light by a light producing means for illumination of said first photovoltaic cell, said light having a predetermined spectral distribution;

(c) sequentially filtering said light by means of a first filter, then by means of a second filter, and then by means of a third filter to produce first, second, and third spectral distributions, respectively, on said first photovoltaic cell, and thereby causing said first photovoltaic cell to sequentially produce first, second, and third output currents, respectively;

(d) measuring said first, second and third output currents as each of said first, second, and third output currents are sequentially produced and producing first, second, and third digital numbers that are respectively representative of the magnitudes of said first, second, and third measured output currents;

(e) computing fourth, fifth, and sixth normalized response coefficients from said first, second and third digital numbers;

(f) computing first, second, and third response differences between said first and fourth normalized response coefficients, between said second and fifth normalized response coefficients, and between said third and sixth normalized response coefficients, respectively;

(g) producing said light for illumination of said second photovoltaic cell;

(h) sequentially filtering that light by means of said first filter, then by means of said second filter, and then by means of said third filter to produce fourth, fifth, and sixth spectral distributions, respectively, on said second photovoltaic cell, and thereby causing said second photovoltaic cell to sequentially produce fourth, fifth, and sixth output currents, respectively;

(i) measuring said fourth, fifth, and sixth output currents as they are sequentially produced and producing fourth, fifth, and sixth digital numbers that are respectively representative of the magnitude of said fourth, fifth, and sixth measured output currents;

(j) computing sevdigital numbers;

(k) computing fourth, fifth, and sixth response differences between said first and seventh normalized response coefficients, between said second and eighth normalized response coefficients, and between said third and ninth normalized response coefficients, respectively;

(l) computing first, second, and third differences between said first and fourth response differences, between said second and fifth response differences, and between said third and sixth response differences, respectively;

(m) computing a spectral response mismatch coefficient by computing the square root of the sum of the squares of said first, second, and third differences; and (n) producing a utilization signal representing said spectral response mismatch coefficient.

12. A method for determining the amount of spectral response mismatch between first and second photovoltaic cells, said method comprising the steps of:

(a) producing light for illumination of said first photovoltaic cell, said light having a predetermined spectral distribution;

(b) sequentially filtering said light by means of a first filter, then by means of a second filter, and then by means of a third filter, to produce first, second, and third spectral distributions, respectively, on said first photovoltaic cell, and thereby causing said first photovoltaic cell to sequentially produce first, second, and third output currents, respectively;

(c) measuring said first, second and third output currents as each of said first, second, and third output currents are sequentially produced and producing first, second, and third digital numbers that are respectively representative of the magnitudes of said first, second, and third measured output currents;

(d) producing said light for illumination of said second photovoltaic cell;

(e) sequentially filtering that light by means of a first filter, then by means of a second filter, and then by means of a third filter to produce said first, second, and third spectral distributions, respectively, on said second photovoltaic cell, thereby causing said second photovoltaic cell to sequentially produce fourth, fifth, and sixth output currents, respectively;

(f) measuring said fourth, fifth, and sixth output currents as they are sequentially produced and producing fourth, fifth, and sixth digital numbers that are respectively representative of the magnitudes of said fourth, fifth, and sixth measured output currents;

(g) computing first, second, and third response differences between said first and fourth digital numbers, between said second and fifth digital numbers, and between said third and sixth digital numbers, respectively;

(h) computing a spectral response mismatch coefficient by computing the square root of the sum of the squares of said first, second, and third response differences; and (i) producing a utilization signal representing said spectral response mismatch coefficient.

13. A method for determining the amount of spectral response mismatch between first and second photovoltaic cells, said method comprising the steps of:

(a) producing light for illumination of said first photovoltaic cell, said light having a predetermined spectral distribution;

(b) sequentially filtering said light by means of a first filter, then by means of a second filter, and then by means of a third filter, to produce first, second, and third spectral distributions, respectively, on said first photovoltaic cell, thereby causing said first photovoltaic cell to sequentially produce first, second, and third output currents, respectively;

(c) measuring said first, second and third output currents as each of said first, second, and third output currents are sequentially produced and producing first, second, and third digital numbers that are respectively representative of the magnitudes of said first, second, and third measured output currents;

(d) computing first, second, and third normalized response coefficients from said first, second and third digital numbers;

(e) producing said light for illumination of said second photovoltaic cell;

(f) sequentially filtering that light by means of said first filter, then by means of said second filter, and then by means of said third filter, to produce said first, second, and third spectral distributions, respectively, on said second photovoltaic cell, thereby causing said second photovoltaic cell to sequentially produce fourth, fifth, and sixth output currents, respectively;

(g) measuring said fourth, fifth, and sixth output currents as each of said fourth, fifth, and sixth output currents are sequentially produced and producing fourth, fifth, and sixth digital numbers that are respectively representative of the magnitudes of said fourth, fifth, and sixth measured output currents;

(h) computing fourth, fifth, and sixth normalized response coefficients from said fourth, fifth, and sixth digital numbers;

(i) computing first, second, and third response differences between said first and fourth normalized response coefficients, between said second and fifth normalized response coefficients, and between said third and sixth normalized response coefficients, respectively;

(j) computing a spectral response mismatch coefficient by computing the square root of the sum of the squares of said first, second, and third response differences; and (k) producing a utilization signal representing said spectral response mismatch coefficient.

14. The method of claims 1, 11, 12, or 13 including operating on said utilization signal to determine in which, if any, of a plurality of predetermined ranges said spectral response mismatch coefficient falls and effecting placement of the present photovoltaic cell in a location corresponding to that predetermined range.

15. An apparatus for determining the amount of spectral response mismatch between first and second photovoltaic cells, said apparatus comprising in combination:

(a) means for storing first, second and third normalized response coefficients corresponding to first, second, and third spectral response distributions of said first photovoltaic cell, the sum of said first, second and third spectral response distributions being equal to a total spectral response distribution of said first photovoltaic cell;

(b) means for producing light for illumination of said second photovoltaic cell, said light having a predetermined spectral distribution;

(c) means for sequentially filtering said light by means of a first filter, then by means of a second filter, and then by means of a third filter, to produce first, second, and third spectral distributions, respectively, on said second photovoltaic cell, and thereby causing said second photovoltaic cell to sequentially produce first, second, and third output currents, respectively;

(d) means for measuring said first, second and third output currents as each of said first, second, and third output currents are sequentially produced and producing first, second, and third digital numbers respectively representative of magnitudes of said first, second and third measured output currents;

(e) first means for computing fourth, fifth, and sixth normalized response coefficients from said first, second and third digital numbers;

(f) second means for computing first, second, and third response differences between said first and fourth normalized response coefficients, between said second and fifth normalized response coefficients, and between said third and sixth normalized response coefficients, respectively;

(g) third means for computing a spectral response mismatch coefficient by computing the square root of the sum of the squares of said first, second, and third response differences; and (h) means for producing a utilization signal representing said spectral response mismatch coefficient.

16. The apparatus of claim 15 wherein said first, second, and third spectral distributions of said first, second, and third filters, respectively, are such that the product of the sum of the first, second, and third spectral distributions with said predetermined spectral distribution of a predetermined light source is equal to the magnitude of the sum of the products of said first, second, and third spectral response distributions of said first photovoltaic cell with said predetermined spectral distribution of said light.

17. The apparatus of claim 16 wherein said light producing means includes a lamp.

18. The apparatus of claim 17 wherein said first, second, and third filters are disposed in a rotatable filter wheel, said apparatus including means for rotating said filter wheel to align said first filter with said lamp during a first time period, to align said second filter with said lamp during a second time period that is exclusive of said first time period, and to align said third filter with said lamp during a third time period that is exclusive of said first and second time periods.

19. The apparatus of claim 18 wherein said first and second photovoltaic cells are composed of silicon, said first and third spectral distributions being in the blue and magenta portions of the visible spectrum, respectively, the magnitude of a rising portion of said first spectral response distribution closely matching the magnitude of a rising portion of said predetermined spectral response distribution of said first photovoltaic cell, and the magnitude of a falling portion of said third spectral response distribution closely matching the magnitude of a falling portion of said predetermined spectral response distribution of said first photovoltaic cell.

20. The apparatus of claim 19 wherein said first, second, and third output currents are short circuit output currents, and said measuring means includes a resistor connected to cause said short circuit output currents to flow through said resistor and a digital voltmeter device connected to measure the voltage across said resistor to produce said first, second, and third digital numbers.

21. The apparatus of claim 20 including a processor means reading said first, second and third digital numbers, said first, second, and third means being included in said processor.

22. The apparatus of claim 21 wherein said fourth, fifth, and sixth normalized response coefficients are computed by said first means in accordance with the equations $$b_2 = \frac{I_{SC_1}}{I_{SC_1} + I_{SC_2} + I_{SC_3}},$$

$$p_2 = \frac{I_{SC_2}}{I_{SC_1} + I_{SC_2} + I_{SC_3}}, \text{ and}$$

$$m_2 = \frac{I_{SC_3}}{I_{SC_1} + I_{SC_2} + I_{SC_3}},$$

wherein $b_2$, $p_2$ and $m_2$ represent said fourth, fifth, and sixth normalized response coefficients, respectively, of said second photovoltaic cell and $I_{SC_1}$, $I_{SC_2}$ and $I_{SC_3}$ represent said first, second, and third digital numbers, respectively.

23. The apparatus of claim 22 wherein said first, second, and third response differences are computed by said second means in accordance with the equations $$\Delta b = b_1 - b_2, \Delta p = p_1 - p_2, \text{ and } \Delta m = m_1 - m_2,$$

wherein $\Delta b$, $\Delta p$, and $\Delta m$ represent said first, second and third response differences, respectively, and $b_1$, $p_1$ and $m_1$ represent said first, second, and third normalized response coefficients, respectively.

24. The apparatus of claim 23 wherein said spectral response mismatch coefficient is computed by said third means in accordance with the equation $$\Delta R = \sqrt{(\Delta b)^2 + (\Delta p)^2 + (\Delta m)^2},$$

wherein $\Delta R$ represents said spectral response mismatch coefficient.

25. The method of claim 11 including causing said first, second, and third spectral distributions to be such that the product of the sum of said first, second, and third spectral distributions with said predetermined spectral distribution of a predetermined light source is equal to the magnitude of the sum of the products of said first, second, and third spectral response distributions of said first photovoltaic cell with said predetermined spectral distribution of said light producing means.

26. The apparatus of claim 15 wherein said second spectral distribution includes a portion of the solar spectrum wherein said first photovoltaic cell produces a major portion of its power.

27. An apparatus for determining the amount of spectral response mismatch between first and second photovoltaic cells, said apparatus comprising in combination:

(a) means for storing first, second and third normalized response coefficients corresponding to first, second, and third spectral response distributions of a reference photovoltaic cell, the sum of said first, second and third spectral response distributions being equal to a total spectral response distribution of said reference photovoltaic cell;

(b) means for producing light for illumination of said first photovoltaic cell, said light having a predetermined spectral distribution;

(c) means for sequentially filtering said light by means of a first filter, then by means of a second filter, and then by means of a third filter to produce first, second, and third spectral distributions, respectively, on said first photovoltaic cell, and thereby causing said first photovoltaic cell to sequentially produce first, second, and third output currents, respectively;

(d) means for measuring said first, second and third output currents as each of said first, second, and third output currents are sequentially produced and producing first, second, and third digital numbers that are respectively representative of the magnitudes of said first, second, and third measured output currents;

(e) means for computing fourth, fifth, and sixth normalized response coefficients from said first, second and third digital numbers;

(f) means for computing first, second, and third response differences between said first and fourth normalized response coefficients, between said second and fifth normalized response coefficients, and between said third and sixth normalized response coefficients, respectively;

(g) means for producing said light for illumination of said second photovoltaic cell;

(h) means for sequentially filtering that light by means of said first filter, then by means of said second filter, and then by means of said third filter to produce fourth, fifth, and sixth spectral distributions, respectively, on said second photovoltaic cell, and thereby causing said second photovoltaic cell to sequentially produce fourth, fifth, and sixth output currents, respectively;

(i) means for measuring said fourth, fifth, and sixth output currents as they are sequentially produced and producing fourth, fifth, and sixth digital numbers that are respectively representative of the magnitude of said fourth, fifth, and sixth measured output currents;

(j) means for computing seventh, eighth, and ninth normalized response coefficients from said fourth, fifth, and sixth digital numbers;

(k) means for computing fourth, fifth, and sixth response differences between said first and seventh normalized response coefficients, between said second and eighth normalized response coefficients, and between said third and ninth normalized response coefficients, respectively;

(l) means for computing first, second, and third differences between said first and fourth response differences, between said second and fifth response differences, and between said third and sixth response differences, respectively;

(m) means for computing a spectral response mismatch coefficient by computing the square root of the sum of the squares of said first, second, and third differences; and (n) means for producing a utilization signal representing said spectral response mismatch coefficient.

28. An apparatus for determining the amount of spectral response mismatch between first and second photovoltaic cells, said apparatus comprising in combination:

(a) means for producing light for illumination of said first photovoltaic cell, said light having a predetermined spectral distribution;

(b) means for sequentially filtering said light by means of a first filter, then by means of a second filter, and then by means of a third filter, to produce first, second, and third spectral distributions, respectively, on said first photovoltaic cell, thereby causing said first photovoltaic cell to sequentially produce first, second, and third output currents, respectively;

(c) means for measuring said first, second and third output currents as each of said first, second, and third output currents are sequentially produced and producing first, second, and third digital numbers that are respectively representative of the magnitudes of said first, second, and third measured output currents;

(d) means for computing first, second, and third normalized response coefficients from said first, second and third digital numbers;

(e) means for producing said light for illumination of said second photovoltaic cell;

(f) means for sequentially filtering that light by means of said first filter, then by means of said second filter, and then by means of said third filter, to produce said first, second, and third spectral distributions, respectively, on said second photovoltaic cell, thereby causing said second photovoltaic cell to sequentially produce fourth, fifth, and sixth output currents, respectively;

(g) means for measuring said fourth, fifth, and sixth output currents as each of said fourth, fifth, and sixth output currents are sequentially produced and producing fourth, fifth, and sixth digital numbers that are respectively representative of the magnitudes of said fourth, fifth, and sixth measured output currents;

(h) means for computing fourth, fifth, and sixth normalized response coefficients from said fourth, fifth, and sixth digital numbers;

(i) means for computing first, second, and third response differences between said first and fourth normalized response coefficients, between said seconrespectively;

(j) means for computing a spectral response mismatch coefficient by computing the square root of the sum of the squares of said first, second, and third response differences; and (k) means for producing a utilization signal representing said spectral response mismatch coefficient.

* * * * *